(12) United States Patent
Stearns et al.

(10) Patent No.: US 7,611,981 B1
(45) Date of Patent: Nov. 3, 2009

(54) OPTIMIZED CIRCUIT DESIGN LAYOUT FOR HIGH PERFORMANCE BALL GRID ARRAY PACKAGES

(75) Inventors: William P. Stearns, Richardson, TX (US); Nozar Hassanzadeh, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1187 days.

(21) Appl. No.: 09/678,318

(22) Filed: Oct. 3, 2000

Related U.S. Application Data

(62) Division of application No. 09/250,641, filed on Feb. 16, 1999, now Pat. No. 6,215,184.

(60) Provisional application No. 60/046,062, filed on May 9, 1997.

(51) Int. Cl.
*H01L 21/28* (2006.01)
(52) U.S. Cl. .................. 438/598; 438/109; 438/112
(58) Field of Classification Search ................. 438/112, 438/109, 121, 50, 598, 468
See application file for complete search history.

(56) References Cited

U.S. PATENT DOCUMENTS

| | | | | | |
|---|---|---|---|---|---|
| 5,409,865 | A | * | 4/1995 | Karnezos | 438/210 |
| 5,424,920 | A | * | 6/1995 | Miyake | 361/735 |
| 5,686,699 | A | * | 11/1997 | Chu et al. | 174/52.4 |
| 5,729,433 | A | * | 3/1998 | Mok | 361/704 |
| 5,744,383 | A | * | 4/1998 | Fritz | 438/111 |
| 5,813,881 | A | * | 9/1998 | Nathan et al. | 438/516 |
| 5,844,168 | A | * | 12/1998 | Schueller et al. | 174/52.4 |
| 6,054,767 | A | * | 4/2000 | Chia et al. | 257/738 |
| 6,075,710 | A | * | 6/2000 | Lau | 361/760 |
| RE36,773 | E | * | 7/2000 | Nomi et al. | 361/760 |
| 6,121,678 | A | * | 9/2000 | Chiu et al. | 257/700 |
| 6,258,632 | B1 | * | 7/2001 | Takebe | 438/127 |
| 6,373,131 | B1 | | 4/2002 | Karnezos | 257/712 |
| 2001/0014491 | A1 | * | 8/2001 | Ohsawa | 438/112 |

FOREIGN PATENT DOCUMENTS

EP 0582052 A1 * 2/1994

* cited by examiner

*Primary Examiner*—Allan R. Wilson
(74) *Attorney, Agent, or Firm*—Wade J. Brady, III; Frederick J. Telecky, Jr.

(57) ABSTRACT

A method of laying out traces for connection of bond pads of a semiconductor chip to a printed wiring board or the like and the layout. There is provided a substrate having top and bottom surfaces with a plurality of rows and columns of vias extending therethrough from the top surface to the bottom surface and having a solder ball secured at the surface of each via. A plurality of pairs of traces is provided on the top surface, each trace of each pair of traces extending to a different one of the vias and extending to vias on a plurality of rows and columns, each of the traces of each pair being spaced from the other trace by a ball pitch, being maximized for identity in length and being maximized for parallelism and spacing. Each of the traces of a pair is preferably further maximized for identity in cross-sectional geometry. A differential signal pair is preferably applied to at least one of a pair of traces. The layout can further include a further surface between the top and bottom surfaces insulated from the top and bottom surfaces, a plurality of the traces being disposed on the further surface.

2 Claims, 2 Drawing Sheets

OPTIMIZED CIRCUIT DESIGN LAYOUT FOR HIGH PERFORMANCE BALL GRID ARRAY PACKAGES

CROSS REFERENCE TO RELATED APPLICATIONS

This application is related to provisional application Ser. No. 60/046,062, filed May 9, 1997, the contents of which are incorporated herein by reference and is a division of Ser. No. 09/250,641, filed Feb. 16, 1999 now U.S. Pat. No. 6,215,184 and priority claimed therein.

BACKGROUND OF THE INVENTION

1. Field of the Invention

This invention relates to a method of laying out traces on a substrate and the layout for connection of a semiconductor chip to a printed wiring board and the like.

2. Brief Description of the Prior Art

Semiconductor integrated circuits are formed in semiconductor chips which contain the electrical circuits. Bond pads are generally disposed on the chip with the chip being mounted within a package and the bond pads being connected by wires to lead frame fingers or the like which extend externally of the chip. The package, after fabrication, is generally secured to a printed wiring board with the lead frame fingers or the like connected to bonding regions on the printed wiring board. The package as well as the electrically conductive members which transfer the signals from the chip to the printed wiring board add to the undesirable loads (i.e., inductances, noise, crosstalk, etc.) which the chip may see with the magnitude of these undesirable loads increasing with increasing chip operating frequency.

A typical package may include a substrate having a cavity which contains a chip within the depression. Bond wires couple bond pads on the chip to individual copper traces on the substrate, the copper traces each extending to an electrically conductive aperture or via which extends through the substrate to an electrically conductive ball pad and a solder ball. The vias and ball pads are formed in a matrix array having plural rows and columns of vias which are located adjacent one or more of the sides defining the depression. Adjacent vias and ball pad centers in a row or a column are spaced apart from each other by a distance defined herein as a "ball pitch", this distance being the dimension from the center of one via or ball pad to the center of the adjacent via or ball pad in the same row or in the same column. The "ball pitch" between all adjacent vias or ball pads in the same row or in the same column is the same. The solder ball is soldered to a pad on a printed wiring board in standard manner as discussed in the above noted copending application to make the connection from the chip to the printed wiring board pad.

The copper traces as well as the bond wires, electrically conductive regions in the vias and surrounding wiring and packaging add additional circuitry to the electrical circuit which bring to the circuit additional resistances, inductances and capacitances. The layout of the circuitry and especially the layout of the traces materially affects the performance of the chip, this being particularly material in the case of differential wiring pairs wherein pairs of wires carry the same or similar signals but are out of phase with each other. It is therefore apparent that a layout is highly desirable which minimizes the above noted problems of the prior art.

SUMMARY OF THE INVENTION

In accordance with the present invention, the above described problems of the prior art are minimized.

Briefly, the path traversed by each trace of each differential wiring pair is adjusted to have a pitch or distance therebetween substantially equal to or less than a ball pitch as defined hereinabove, to be parallel to each for the maximum possible distance, to each be as close as possible to the same length and to have the same cross-sectional geometry to the closest extent possible. In other words, it is a requirement that the parallel positioning of the trace portion of each differential wiring pair be maximized to the greatest possible extent and that the trace lengths be equalized to the greatest possible extent. The quality of the differential pairs is dependent upon each of (1) the degree of parallelism, (2) equality of length and (3) substantial identity of geometry and spacing between the cross-sections of the two traces forming the differential pair. It is also necessary that each trace of the differential pair be equally spaced from the ground plane, if present, and be tailored to provide maximal performance with respect to the ground plane. The geometry of design is set up to match odd/even mode circuit impedance. Accordingly, the dielectric constant of the substrate separating the signal plane from the ground plane can be controlled to control the impedance in the signal lines as is well known. The geometric relationship between the width, separation, thickness and distance from the ground plane of the conductors also affects the impedance of the conductors.

In the present state of the art, it is possible to provide at most two signal traces between a pair of adjacent columns at minimum ball pitch. In order to meet the above criteria, it has been found that the above described maximization is obtained, with reference to FIG. 4, by connecting pairs in the manner 1-2, 1-2 and 3-3. This means that, given three adjacent columns 0, 1, 2 and three rows of vias 1, 2, 3 or connection locations in those columns, a first pair of traces will be connected to rows 1 and 2 of a column 1 with the trace connected to row 2 travelling between the columns 0 and 1, a second pair of traces will be connected to rows 1 and 2 of column 2 with the trace connected to row 2 extending between columns 2 and 3 and a third pair of traces which pass between columns 1 and 2 and are connected to the third row in each of these columns. In the event the technology permits more than two traces to be passed between a pair of adjacent rows, the above manner of connection would be altered, as is apparent.

It should be understood that, though the above described circuit has been laid out to accommodate differential pairs, each trace of each differential pair can be used to accommodate other types of signals.

It should be understood that the above described layout of signal traces can also be provided wherein the ball grid array is disposed on the same surface as the as the signal trace layout with the vias being eliminated, similar to the embodiment of FIG. 3 and in the above referenced copending application but with the additional column and connections thereto as in the subject specification.

Advantages of the layout in accordance with the present invention are: improved electrical performance, suitability for high frequency applications and flexibility to use nearly all signal traces as differential pairs or single ended lines. Crosstalk is also substantially reduced.

DESCRIPTION OF THE PREFERRED EMBODIMENT

Figure 1:
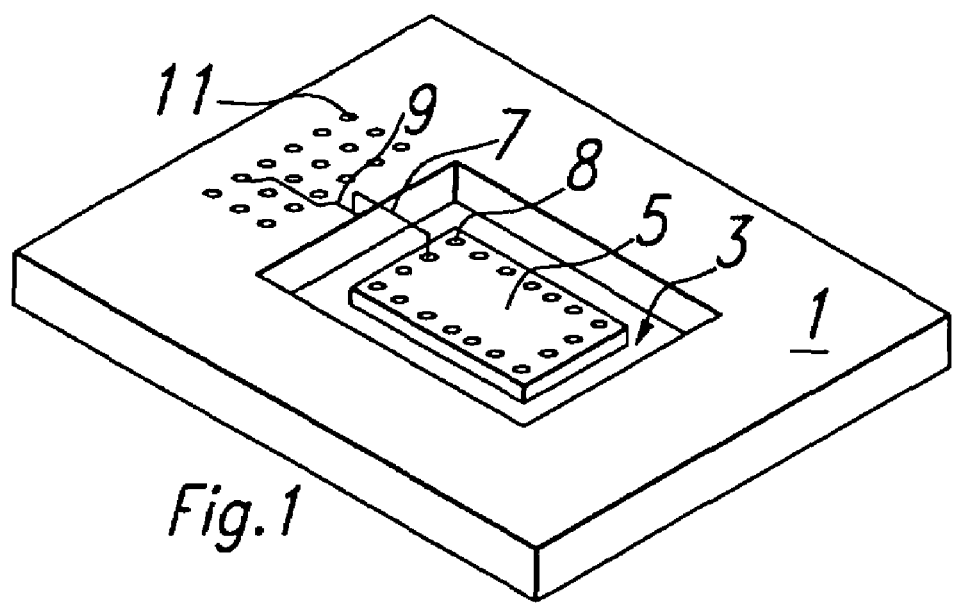
FIG. 1 is a schematic diagram of a typical package which can be used in accordance with the prior art as well as in accordance with the present invention.
Figure 2:
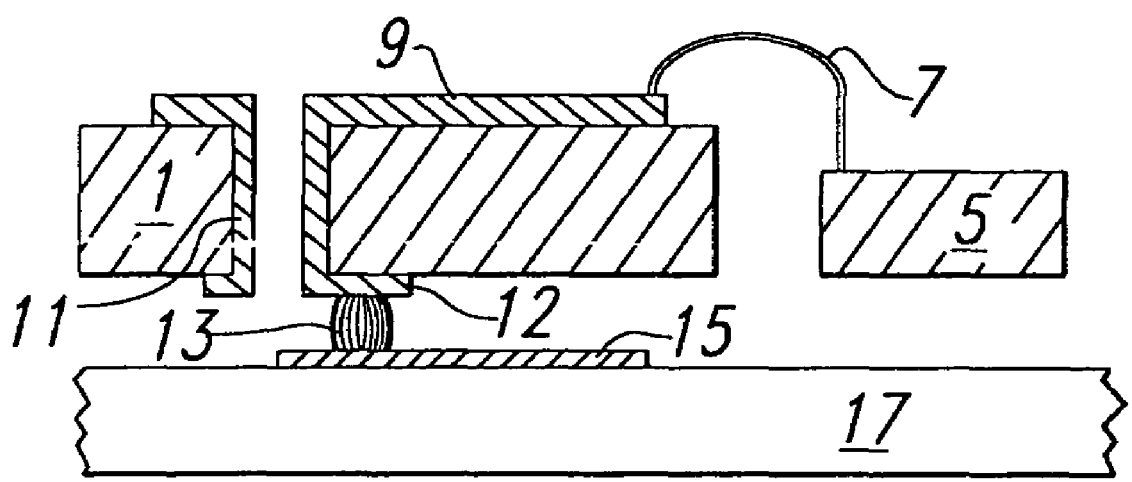
FIG. 2 is a cross sectional view of a portion of the package of FIG. 1 connected to a printed wiring board.

Referring to FIG. 1, there is shown a typical package which can be used in accordance with the prior art as well as in accordance with the present invention. The package is shown with the encapsulation removed and includes a substrate 1 having a depression 3 which contains a chip 5. Bond wires 7 couple bond pads 8 on the chip 5 to individual copper traces 9 on the substrate, the copper traces each extending to an electrically conductive aperture or via 11 which extends through the substrate to a solder ball pad 12 and solder ball 13 as shown in FIG. 2. The vias 11 and solder pad 12 are formed in a matrix array, there being plural rows and columns of vias which can be located adjacent one or more of the sides defining the depression 3. The solder ball 13 is soldered to a pad 15 on the printed wiring board 17 in standard manner as discussed in the above noted copending application to make the connection from the chip 5 to the printed wiring board terminal. While the traces 9 are shown on only one layer, it should be understood that there can be plural layers of signal traces separated by electrically insulating layers with vias extending from the top or interior layer of the substrate to the lower layer which contains ball pads and may also contain circuitry for additional electrical connections from the chip through substrate circuitry to the solder balls connected to the printed wiring board. It should be understood that the above described layout of signal traces and substrate circuitry may also be inverted in a "cavity-down" configuration such that the solder balls are connected to the same side of the substrate as the chip.

The copper trace 9 as well as the bond wires 7, electrically conductive region in the via 11 and surrounding wiring add additional circuitry to the electrical circuit which bring to the circuit additional resistances, inductances and capacitances. The layout of the circuitry and especially the traces 9 materially affect the performance of the chip, this being particularly material in the case of differential wiring pairs wherein pairs of wires carry the same or similar signals but are out of phase with each other. In accordance with the present invention, the path traversed by each trace 9 of each differential wiring pair is adjusted to have a pitch or distance therebetween from trace center line to trace center line of up to one solder ball 13 pitch, to be parallel to each for the maximum possible distance, to each be as close as possible to the same length and to have the same cross-sectional geometry to the closest extent possible. The pitch of the solder ball is set by the industry for the size of the package being used and varies, depending upon package size. In other words, it is a requirement that the parallel positioning of the trace portion of each differential wiring pair be maximized to the greatest possible extent and that the trace lengths be equalized to the greatest possible extent. The quality of the differential pairs is dependent upon each of (1) the degree of parallelism, (2) equality of length and (3) identity of cross-sectional geometry and spacing between the two traces forming the differential pair. It is also necessary that each trace of a differential pair be equally spaced from the ground plane.

Figure 3:
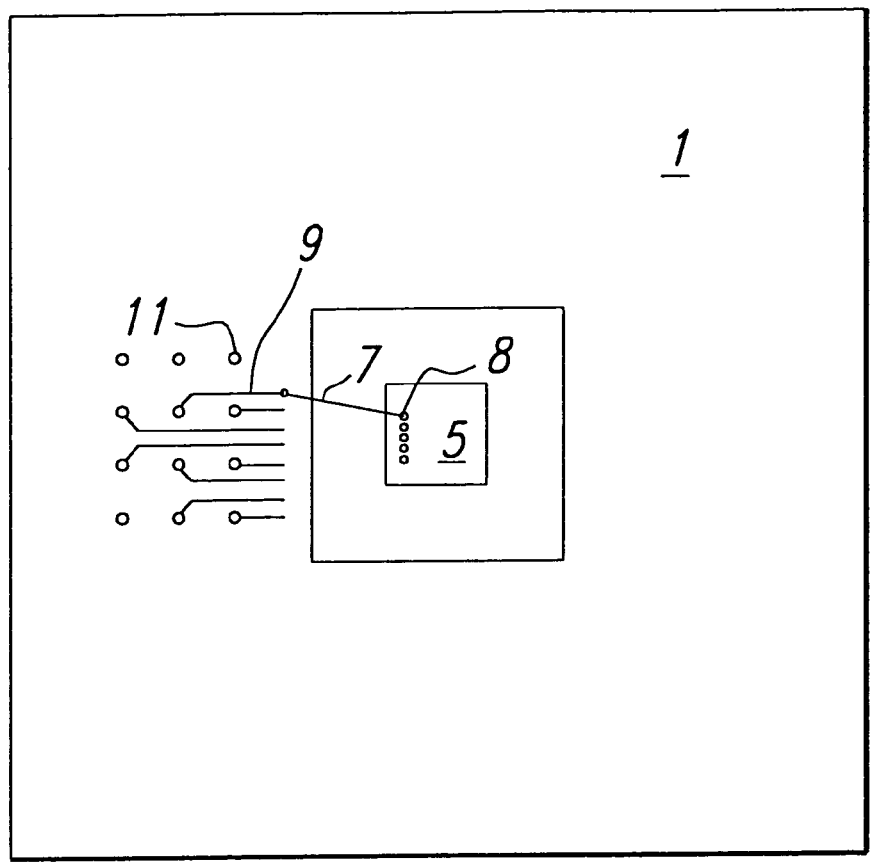
FIG. 3 is a schematic diagram of a layout in accordance with the present invention.
Figure 4:
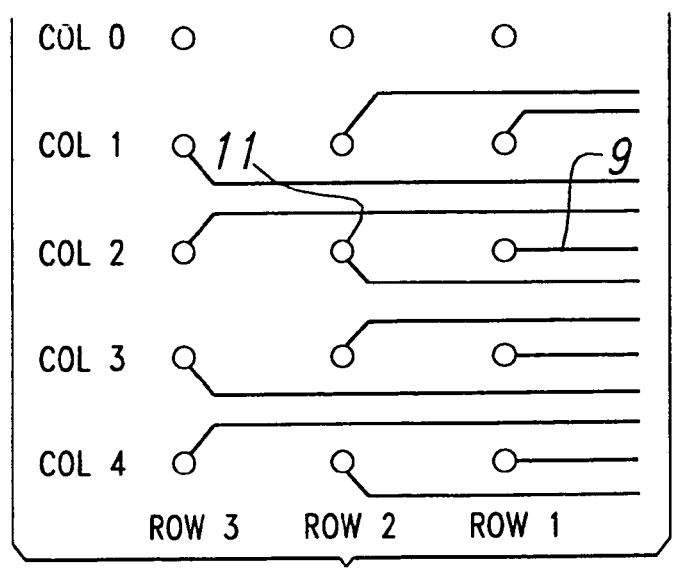
FIG. 4 is a preferred layout using three rows of vias for connection to the chip and a pair of traces between each pair of columns of vias.

In the present state of the art, it is possible to provide at most two signal traces between a pair of adjacent rows at minimum ball pitch. In order to meet the above criteria, it has been found that the above described maximization is obtained by connecting pairs in the manner 1-2, 1-2 and 3-3 as shown in FIGS. 3 and 4. In the event more or less than two traces can be or are passed between a pair of adjacent rows, the above manner of connection would be altered as is apparent.

It should be understood that, though the above described circuit has been laid out to accommodate differential pairs, each trace of each differential pair can be used to accommodate other types of signals.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

The invention claimed is:

1. A method of laying out traces for connection of bond pads of a semiconductor chip to a ball grid array disposed on a substrate, which comprises the steps of:
   (a) providing a substrate having a surface with a plurality of rows and columns of ball pads and having a solder ball secured to each of said ball pads; and
   (b) providing a plurality of pairs of traces on said surface, each trace of each of said pairs of traces extending to a different one of said ball pads and extending to ball pads on a plurality of said rows and columns, each trace of each of said pair of traces being spaced from the other trace of said pair by up to a ball pitch, being maximized for identity in length and having up to one ball pitch difference in length and being maximized for parallelism and spacing;
   wherein said substrate has at least first, second and third rows and first, second, third and fourth columns of said ball pads in a matrix array, a first trace of a first pair of said traces extending to a ball pad in said first row of said second column closest to said chip and a second trace of said first pair of traces extending to a ball pad in said second row of said second column and between said first column and second column which is adjacent to said first column, a first trace of a second pair of said traces extending to a ball pad in said first row of said third column closest to said chip and a second trace of said second pair of traces extending to a ball pad in said second row of said third column and between said third column and said fourth column which is adjacent to said third column, and first and second traces of a third pair of said traces extending to ball pads in said third row of said second and third columns and disposed between said second and third columns.

2. The method of claim 1 wherein said substrate is a printed wiring board.

* * * * *

UNITED STATES PATENT AND TRADEMARK OFFICE
CERTIFICATE OF CORRECTION

PATENT NO. : 7,611,981 B1  Page 1 of 1
APPLICATION NO. : 09/678318
DATED : November 3, 2009
INVENTOR(S) : Stearns et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 47 days.

Signed and Sealed this

Nineteenth Day of October, 2010

David J. Kappos
*Director of the United States Patent and Trademark Office*